United States Patent
Sullivan

(10) Patent No.: US 6,180,506 B1
(45) Date of Patent: Jan. 30, 2001

(54) UPPER REDUNDANT LAYER FOR DAMASCENE METALLIZATION

(75) Inventor: Timothy D. Sullivan, Underhill, VT (US)

(73) Assignee: International Business Machines Corporation, Armonk, NY (US)

(*) Notice: Under 35 U.S.C. 154(b), the term of this patent shall be extended for 0 days.

(21) Appl. No.: 09/152,836

(22) Filed: Sep. 14, 1998

(51) Int. Cl.[7] .............................................. H01L 21/4763
(52) U.S. Cl. .......................... 438/618; 438/625; 438/627; 438/633; 438/637; 438/643; 438/644
(58) Field of Search ........................... 438/618, 643, 438/658, 660, 669, 627, 763, 625, 637, 633, 644, 666, 700

(56) References Cited

U.S. PATENT DOCUMENTS

| | | | |
|---|---|---|---|
| 4,984,060 | 1/1991 | Ohmi et al. | 357/68 |
| 5,098,860 | 3/1992 | Chakravorty et al. | 437/195 |
| 5,219,787 | 6/1993 | Carey et al. | 437/187 |
| 5,266,526 | 11/1993 | Aoyama et al. | 437/195 |
| 5,585,673 | 12/1996 | Joshi et al. | 257/751 |
| 5,600,182 | 2/1997 | Schinella et al. | 257/763 |
| 5,602,423 | 2/1997 | Jain | 257/752 |
| 5,614,765 | 3/1997 | Avanzino et al | 257/774 |
| 5,656,542 | 8/1997 | Miyata et al. | 438/645 |
| 5,661,345 | 8/1997 | Wada et al. | 257/767 |
| 5,747,361 | * 5/1998 | Ouellet | 438/643 |
| 5,783,485 | * 7/1998 | Ong et al. | 438/637 |
| 5,895,265 | * 4/1999 | Inoue et al. | 438/643 |
| 5,925,933 | * 7/1999 | Colgan et al. | 257/762 |

* cited by examiner

Primary Examiner—David Nelms
Assistant Examiner—Reneé R. Berry
(74) Attorney, Agent, or Firm—Ratner & Prestia; Jay H. Anderson, Esq.

(57) ABSTRACT

A multi-film damascene metal interconnect line for a semiconductor device and the method for manufacturing the interconnect line. The interconnect line has a redundant layer film included within the top surface of the interconnect line which reduces stress voiding and electromigration. The interconnect line is produced by depositing a redundant film part-way through the deposition of the bulk metal film and does not require additional polishing steps.

20 Claims, 4 Drawing Sheets

UPPER REDUNDANT LAYER FOR DAMASCENE METALLIZATION

FIELD OF THE INVENTION

The present invention relates generally to semiconductor integrated circuit devices. More specifically, it relates to damascene conductor lines formed within an integrated circuit. This invention also relates to the method for producing such a damascene conducting line within a semiconductor integrated circuit.

BACKGROUND OF THE INVENTION

Integrated circuits may contain millions of transistors and other circuit elements fabricated on a single semiconductor substrate chip. For an integrated circuit device to be functional, a complex array of signal pads must be routed to connect the circuit elements distributed on the surface of the chip. This routing is done through the use of a wiring network that includes metal interconnect lines formed from a metal conductive film which is deposited onto the surface, then patterned. As complexity and level of integration grow, the efficient routing of signals across an integrated circuit chip becomes increasingly more difficult.

In recent years, to address this need, it has become increasingly popular for an integrated circuit device to contain multiple layers of an interconnect material (i.e., multi-level metallization), each of which can connect the transistors and other circuit elements which comprise an integrated circuit device. After each metallization layer is deposited, a series of metal interconnect lines must be formed from that metallization level. There are a number of techniques which can be used to produce the patterned wiring circuitry needed to connect the transistors and other circuit elements. One method of patterning the interconnect film is to deposit the conductive metal film on top of the device surface, use a photosensitive film to produce a pattern on top of the conductive metal film, then etch away the exposed portions of the film to produce a pattern of the metal film which is wholly on top of the existing structure.

Another, more attractive process used to produce this patterning within a metal interconnect film is the damascene technique. This technique involves first forming a network of channels within the top surface of a preferably planar insulation layer, typically a dielectric film. Then, a conductive film is deposited on top of the etched insulation layer, as well as into the channel, which preferably becomes filled with the conductive material. Subsequent planarization and polishing processes remove the conductive film from the top-most surface of the insulation layer and leave the conducting material in the channels, thereby forming a series of patterned conductive metal lines. This process is described in detail in U.S. Pat. No. 4,944,836 issued to Byer et al. on Jul. 31, 1990.

The damascene technique is particularly attractive because, after the interconnect wires are defined, the resulting upper surface is planar. Step coverage issues need not be addressed during subsequent processing levels for a planar surface. Therefore, the deposition and patterning of subsequent metal films is made much easier. A major limitation in multi-level metallization integrated circuit devices is the issue of step coverage of the multiple metallization layers. When one metallization line traverses a previously produced line of metal or other underlying film, with a conformal dielectric film in between them, undesirable effects result at the point where the upper metal film steps over the patterned lower metal film. The patterning and etching process for the second layer metal can produce defects at the point where the upper level metallization steps over the underlying pattern; the film may be thinner and more subject to attack than the bulk of the metal line in the upper layer.

When multiple layers of metallization are used, this effect is multiplied. Not only are there more steps, and more layers of steps, but steps with more severe heights result at the intersection point where a metal line criss-crosses an underlying metal line. These problems are due, in part, to the substantially planar nature of a coated photoresist film. In the worst case, these intersection points may protrude above the photoresist film. If this occurs, then the exposed film may be subject to attack or destruction during subsequent processing.

In addition to the previous concerns, a subsequently deposited film may not completely cover these extreme steps. With the damascene process, the metal and the dielectric which insulates the metal form one planar surface at each metallization level, and step coverage issues need not be addressed for subsequent processes. This is a significant advantage of the damascene process.

The damascene process is understood to be limited, however, by the difficulty of incorporating a barrier metal, also known as a redundant or shunt layer, within the metallized film. The metal films commonly used to form the interconnect level of semiconductor devices are typically aluminum alloys. Aluminum copper (AlCu), aluminum silicon (AlSi), and aluminum copper silicon (AlCuSi) are some of the more common alloys used in semiconductor processing. Without a barrier layer metal, these aluminum alloy films are subject to voiding due to stress, and failure due to electromigration. These effects are highly undesirable in semiconductor integrated circuit fabrication; they make multi-level metallization devices vulnerable to failure by producing opens at the interface where one level of metal contacts another.

In the semiconductor processing industry, the deposition of the barrier metal is typically done following the complete deposition of the bulk metal or metal alloy film (e.g., AlCu) which forms the conductive part of the interconnect wire. Because the channels are completely filled by this bulk film in the damascene process, however, a redundant layer positioned on top of the bulk film and over the top of the channel is removed when the subsequent planarization and polishing process takes place.

A method of adding a barrier metal to a damascene metal line involves initially polishing the bulk film to a depth lower than that of the top surface of the dielectric film. Then a barrier metal film, typically a refractory metal, is deposited to fill the channel. The barrier metal film must be later polished, however, as was the bulk film. This method requires additional processing steps and material. Therefore, it requires additional expense and is undesirable.

The deficiencies of the current damascene metallization technique show that a need exists for a process to produce a damascene metallization line which contains a barrier metal and does not require additional processing steps. An object of the subject invention is to present a damascene metal line which includes a barrier metal. Another object is to refine and improve the manufacturing process to produce such a line.

SUMMARY OF THE INVENTION

To achieve these and other objects, and in view of its purposes, the present invention addresses the shortcomings of the damascene processes known to the prior art and provides an improvement to the current damascene technology. The present invention provides a method for forming a damascene metallization line using a bulk metal conductive film and also containing a layer of barrier metal to prevent electromigration failure and stress voiding, without additional processing steps, and therefore without the associated additional expenses.

An upper redundant layer can be formed by depositing either a reactive or non-reactive layer part-way through the deposition of the bulk metal conductive film onto the substrate. The point at which the deposition of the bulk metal film is stopped and when the additional barrier layer is introduced is chosen based on the width of the feature to be filled.

First, an opening such as a trench is created within the top surface of a dielectric film formed on the semiconductor substrate. Then, the aluminum alloy or other bulk metal conductive film is deposited onto the surface. The deposition is stopped when the film partially fills the channels within the dielectric, leaving a "trench-within-a-trench."

Deposition of a redundant layer such as a barrier metal follows. The barrier metal layer is deposited onto the bulk metal conductive film surface and at least partially fills the trench-within-a-trench. If the barrier metal layer, such as titanium, is reactive towards the bulk metal conductive film, such as an aluminum alloy, then the semiconductor wafer or substrate is annealed, to react the titanium and aluminum to produce an intermetallic compound, and then polished. If the layers are unreactive, such as TiN and aluminum alloys, then the annealing step is omitted.

A step of polishing removes both the bulk metal conductive film and the redundant layer film in regions where they are disposed atop the dielectric film, and removes all of the redundant layer except for a portion down is the center of the trench. Vias are formed in subsequent layers to provide a contact from this metallization layer to a subsequently deposited and patterned layer. The top surface of the damascene metal line, which will be contacted to a subsequent line, includes a portion of the barrier metal of the redundant layer. The presence of the barrier material maintains contact between the metallization layers even if a void should be created in the aluminum portion of the line due, for example, to stress voiding or electromigration. The presence of this barrier metal also suppresses electromigration of the aluminum alloy film, which is particularly important during life and heat cycling and which delays electromigration failure of the line during the life of the integrated circuit device.

Another example of the present invention involves the deposition of three films to form the damascene conductive wire within the trench. The bulk metal conductive film (as above) is deposited first. In this alternate method, however, the point at which the deposition of the initial bulk metal conductive film is stopped, to allow for the deposition of the redundant layer to begin, is different from the method described above. The point of deposition and the film thicknesses are chosen so that, after the redundant layer is deposited on top of the initially deposited bulk metal conductive film, a trench-within-a-trench still exists within the trench initially formed in the dielectric film. The barrier metal/redundant film is deposited second, partially filling the trench-within-the-trench, but still leaving a smaller trench-within-the-trench. After the deposition of the redundant film, a second deposition involving a bulk metal conductive film is completed. Part of this bulk conductive film will fill the remaining trench-within-a-trench, which still exists after the deposition of the redundant film. Most commonly, the bulk metal conductive film may be an aluminum alloy.

The thickness of the films will depend on the width of the feature to be filled, the conformality of the film deposited, and the method of deposition of the films. For this three-film example, thicknesses can be chosen so that a trench-within-a-trench still remains after the deposition of the redundant film. After the three films have been deposited, the wafer may be annealed to form an intermetallic compound if the redundant film is reactive toward the bulk metal conductive film. If the redundant film is unreactive, this annealing step is unnecessary.

At this point, a planarization technique is applied to planarize the surface as with the first example discussed above. This technique will produce a metallization line within the trench which has an upper surface substantially planar with the dielectric material in which it is entrenched. In this second example, the top surface of the metal line (the portion to which any subsequent metal film will be contacted) will contain regions of the second deposited bulk metal conductive film, the redundant layer film, and possibly also the initially deposited bulk metal conductive film— depending on the deposition conditions and features of the initial trench and the point at which the aluminum deposition was stopped. As in the first example, the resulting metal line is composed largely of the bulk metal conductive material, most commonly an aluminum alloy. The metal line will contain a redundant film which makes the line resistant to electromigration failure and makes resistant to stress voiding the contact point between this aluminum film and, for example, a subsequently deposited aluminum film. Part of the redundant film will form the top surface of this metal line.

Alternate embodiments of the present invention include a barrier film liner added to the dielectric trench before the deposition of the first bulk aluminum or other bulk metal conductive film. Subsequent formation of the two or three film conductive line, including a barrier metal film, is similar to that of the previous examples. In this embodiment, however, the film thicknesses used to produce the structure are chosen based upon the initial geometry of the trench, which includes the barrier film liner.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 7 is a cross-section showing a redundant layer deposited on the bulk metal conductive film of FIG. 6;

FIG. 8 is a cross-section showing a second bulk metal conductive film deposited on the redundant layer of FIG. 7;

FIG. 9 is a cross-section showing the polished damascene line;

FIG. 10 is a perspective view showing the damascene line produced by the second embodiment.

DETAILED DESCRIPTION OF THE PREFERRED EMBODIMENTS

Figure 1:
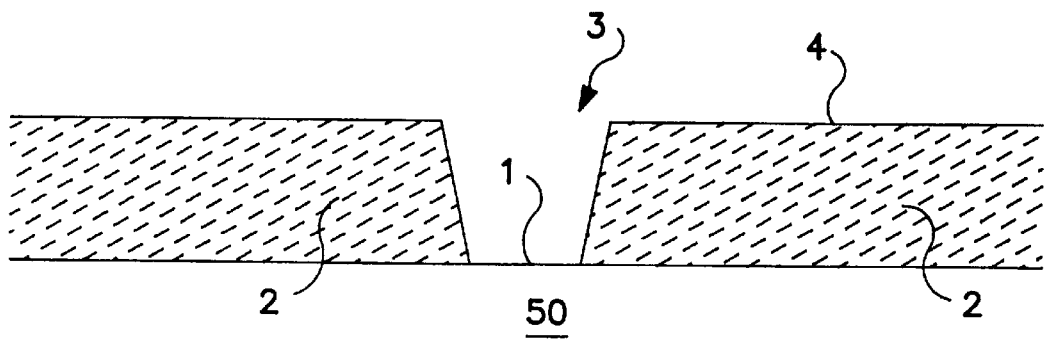
FIG. 1 is a cross-sectional view of a trench formed within a dielectric material of an integrated circuit.

FIG. 1 shows the cross-section of an opening 3 formed within a dielectric film 2 deposited on a semiconductor substrate. The film may be any suitable dielectric chosen to isolate electrically conductive wires from each other. The opening 3 may represent a via, a groove, a channel, or a trench as depicted in FIG. 1. The definition and formation of the trench within the dielectric film may be accomplished by a number of processes, such as dry etching of the dielectric film. Although the first exemplary embodiment depicts a cross-section which may be a via or a trench with a trapezoidal cross-section, any suitable feature within a dielectric film may be chosen. The bottom surface 1 of the opening 3 formed in the trench may represent the upper surface of a subjacent film on which the dielectric film 2 is deposited. The subjacent film 50 may represent a conductive film or semiconductor film to which the metal line being created will be connected, or it may represent another dielectric film which would insulate any metal line formed in the trench from other conductive features. The opening 3 is the feature in which the conductive wire will be formed. The dielectric film includes a top surface 4, which is generally planar with the substrate.

Figure 1A:
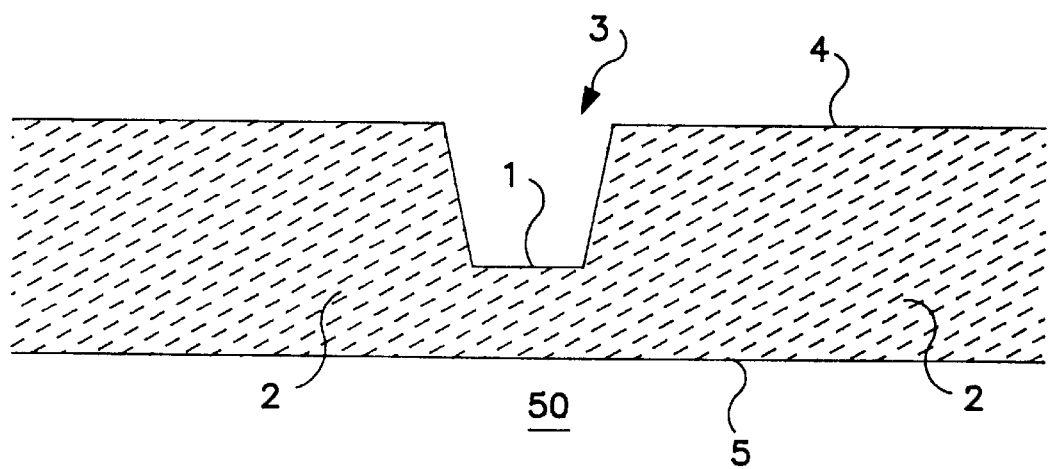
FIG. 1A is a cross-sectional view of a trench formed within a dielectric material of an integrated circuit, where the trench does not extend to the lower surface of the dielectric film.

Alternatively, FIG. 1A depicts a cross-section of a trench or opening 3 formed within a dielectric film 2 wherein the bottom surface 1 of the trench or opening 3 does not extend down to the bottom surface 5 of the dielectric film. In the embodiment shown in FIG. 1A, the interconnecting metal line to be formed would not be connected to an underlying conductive or semiconductor film 50; the metal line is totally entrenched within the opening 3 formed within the dielectric film 2.

Figure 2:
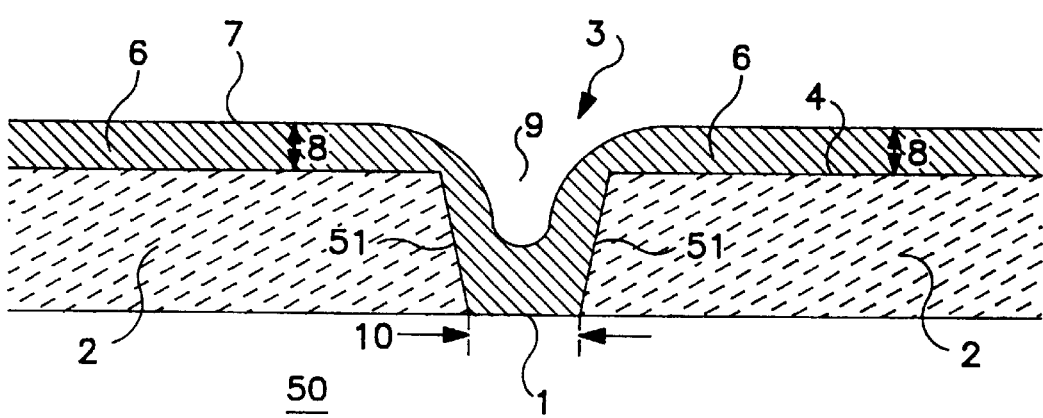
FIG. 2 is a cross-sectional view showing a bulk metal conductive film deposited in the trench of FIG. 1.

FIG. 2 shows a bulk metal conductive film 6 deposited on the top surface 4 of dielectric film 2 and within the opening 3 formed in the dielectric film 2. The bulk metal conductive film may be any suitable film used in the semiconductor industry, such as an aluminum alloy, copper, or a copper alloy. Aluminum alloys including copper, silicon, or both copper and silicon, may be used. Any suitable deposition technique may be used. Any set of deposition conditions may be used to deposit the metal conductive film onto both the top surface 4 of the dielectric film and within the trench area or opening 3. The metal conductive film 6 covers both the bottom surface 1 and the sidewalls 51 of the opening 3. The thickness 8 of the metal conductive film 6 is chosen so that, after the deposition of the metal conductive film 6 is complete, a void 9 still exists within the initial opening 3 constituting the integrated circuit trench. This void 9 may be understood to comprise a trench-within-a-trench. An exemplary thickness 8 of the bulk metal conductive film may be slightly less than one-half of the minimum width 10 of the opening feature (the trench, as shown) which is being filled, so that the initial opening 3 is not completely filled after deposition of the bulk metal conductive film 6. The metal conductive film 6 has a top surface 7.

Figure 3:
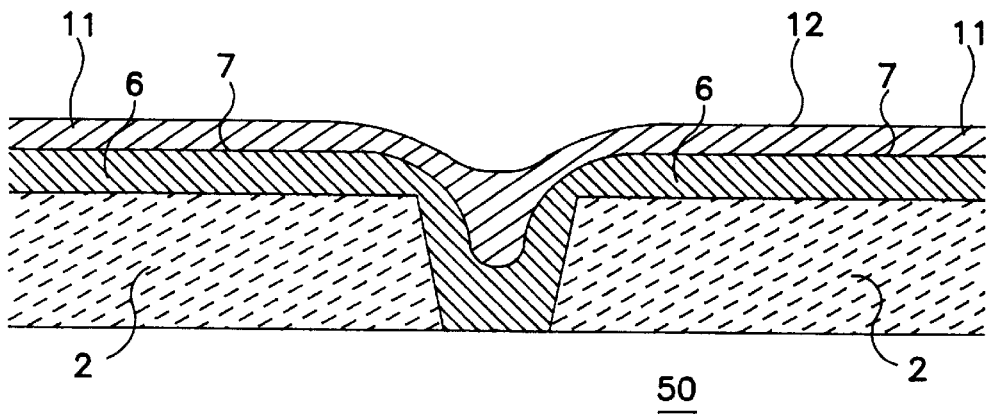
FIG. 3 is a cross-sectional view showing a redundant layer deposited on the bulk metal conductive film of FIG. 2.

FIG. 3 shows a cross-section of a subsequently deposited redundant layer film 11 on top of the top surface 7 of the metal conductive film 6. The redundant layer has a. top surface 12. The redundant layer film is a barrier metal commonly used in the semiconductor industry. Titanium (Ti), Titanium-Nitride (TiN), Tungsten (W), Titanium-Tungsten (TiW), and other refractory metals are common examples of barrier metals. They are chosen for their ability to suppress electromigration failure of the bulk metal (aluminum) conductive film, and may be chosen to be either reactive or unreactive with the bulk film. If the redundant layer chosen is reactive with the bulk metal conductive film, chosen, then an annealing process, which forms an intermetallic compound, is conducted before polishing. Note that the trench-within-a trench of FIG. 2 (void 9) is now completely filled. The original trench opening 3 is now completely filled with either the bulk metal conductive film. 6 or the redundant layer film 11.

Figure 4:
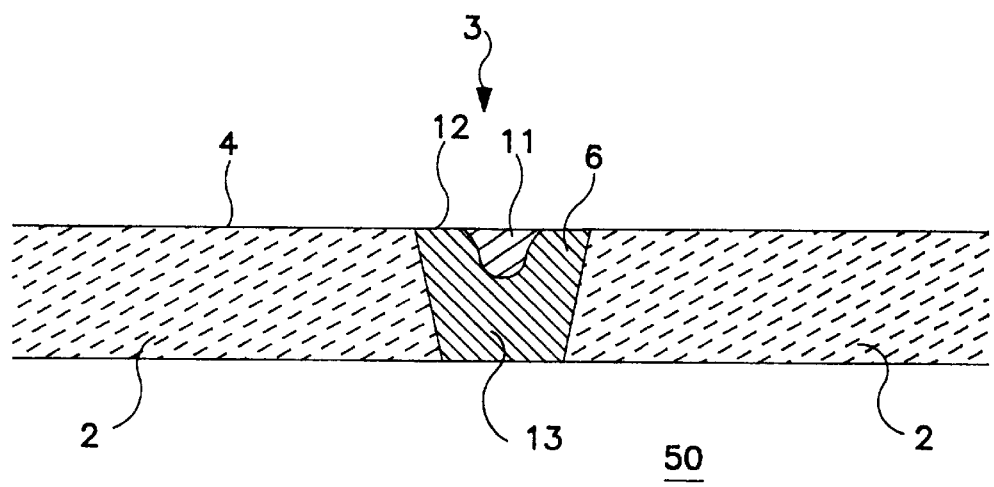
FIG. 4 is a cross-sectional view of the damascene line produced after polishing.

FIG. 4 shows the two-film metal conductive wire or line 13 formed within the opening 3 after the planarization and polishing process. The process removes the films 6, 11 from the top surface 4 of the dielectric film 2. Following the process, the top surface 12 of the metal conductive line 13 is substantially planar with the top surface 4 of the original dielectric film 2 and contains portions of both the redundant layer film 11 and the bulk metal conductive film 6. Any acceptable planarizing or polishing process can be used to remove the films 6, 11 from the top surface 4 of the dielectric film 2 and leave the trench area filled with the metal conductive line 13. One such process is chemical mechanical polishing (CMP) which is favored in the semiconductor industry today.

Figure 5:
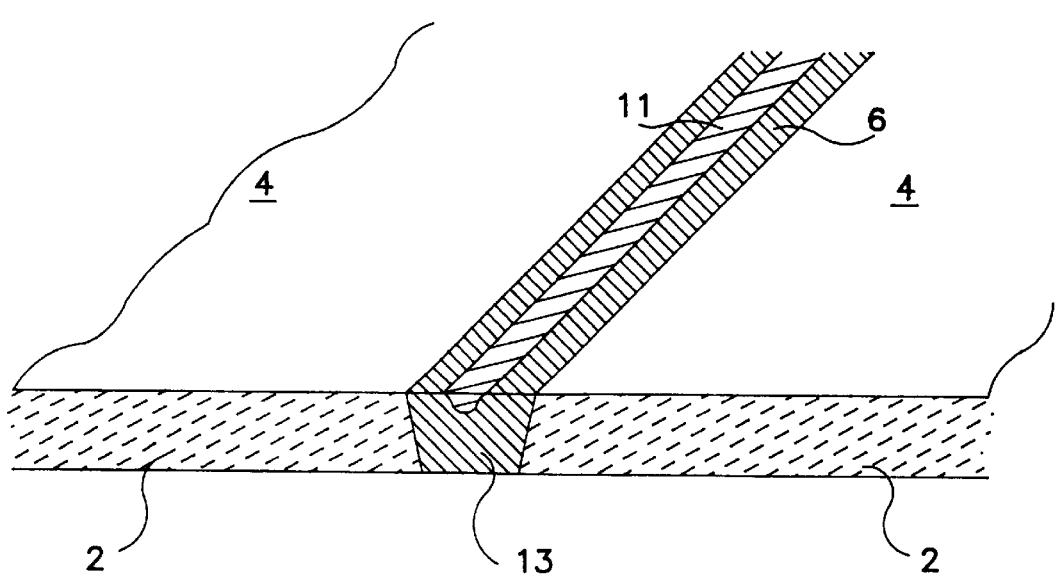
FIG. 5 is a perspective view of a damascene line formed within the trench.

FIG. 5 shows a perspective view of the metal conductive line 13 depicted in the FIG. 4 cross-section. For the trench configuration shown in FIG. 5, the redundant layer film 11 forms a stripe along the center of metal conductive line 13. The top surface 12 of the metal conductive line 13 is comprised of portions of both the first deposited bulk metal (aluminum) conductive film 6 and the second deposited film, which may be a refractory metal redundant layer film 11. The refractory metal redundant layer film 11 provides resistance to electromigration failure of the metal conductive line during subsequent life-cycle testing, heat-cycle testing, and throughout the life of the device.

Also, because the refractory metal redundant layer film 11 forms part of the top surface 12 of the metal conductive line 13, the present invention provides an advantage in that any subsequent contacts (not pictured) made between the top surface 12 of the metal conductive line 13 and a subsequently deposited metal film will contact a portion of the redundant layer film 11. Contact with the redundant layer film 11 is a most prominent feature of the present invention. Such contact prevents stress voiding between the metal conductive line 13 and especially a subsequently deposited metal conductive film (not shown) by maintaining contact between the overlying, subsequently deposited metal film and the metal conductive line 13.

Figure 6:
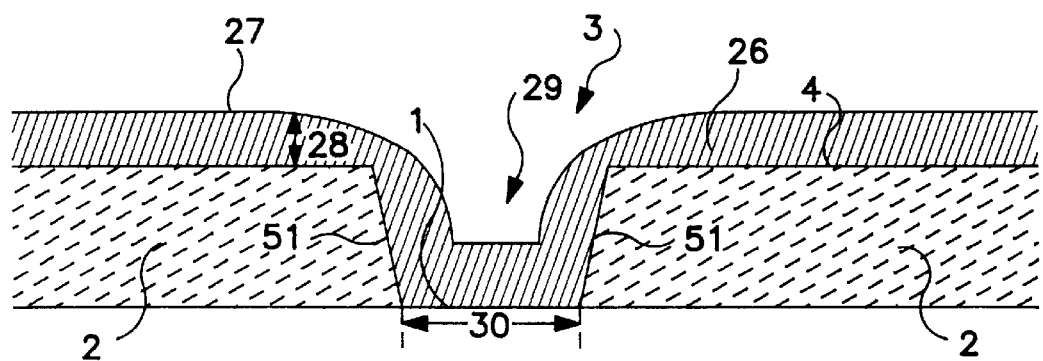
FIG. 6 through FIG. 10 depict the processing sequence used to form a second embodiment of the present invention, a damascene line formed of three films, with FIG. 6 illustrating a cross-section of a bulk metal conductive film deposited in a trench formed in a dielectric film.

FIGS. 6 through 10 show the process sequence and the finished metal conductive line produced by a second preferred embodiment of the present invention. FIG. 6 shows a cross-section of a bulk metal conductive film 26 deposited on the semiconductor surface which includes an opening 3 formed within a dielectric film 2. The opening 3 may be a groove, a channel, a round via opening, or a trench as in the exemplary embodiment. The conductive metal film 26 both covers the top surface 4 of the dielectric film 2 and partially fills in the trench 3 formed within the dielectric film 2. The conductive metal film 26 covers both the bottom surface 1 and the sidewalls 51 of trench 3. In this second exemplary embodiment, the thickness 28 of the first deposited conductive metal film 26 is chosen so that the trench-within-a-trench area 29, formed within the original trench 3 by the aluminum alloy film 26, is sized to allow portions of both the refractory metal film and a second deposited bulk metal conductive (typically aluminum) film within the original trench 3. Typically, the thickness 28 of the conductive metal film 26 is chosen to be less than half of the width 30 of the trench 3 formed within the dielectric film 2. Consequently, the trench-within-the-trench, which results after formation of metal film 26, is sized to accommodate both a refractory metal film and a second deposited conductive metal film to fill the trench 3.

As with the first exemplary embodiment, any suitable method of depositing the bulk metal conductive film. 26 may be chosen. The bulk metal conductive film 26 may be any suitable material, such as an aluminum alloy, copper, or a copper alloy. The conditions of deposition may also be any suitable conditions chosen in the semiconductor industry so that the conductive metal film 26 both covers the top surface 4 of the dielectric film 2 and partially fills the trench 3 formed within the dielectric film 2.

Figure 7:
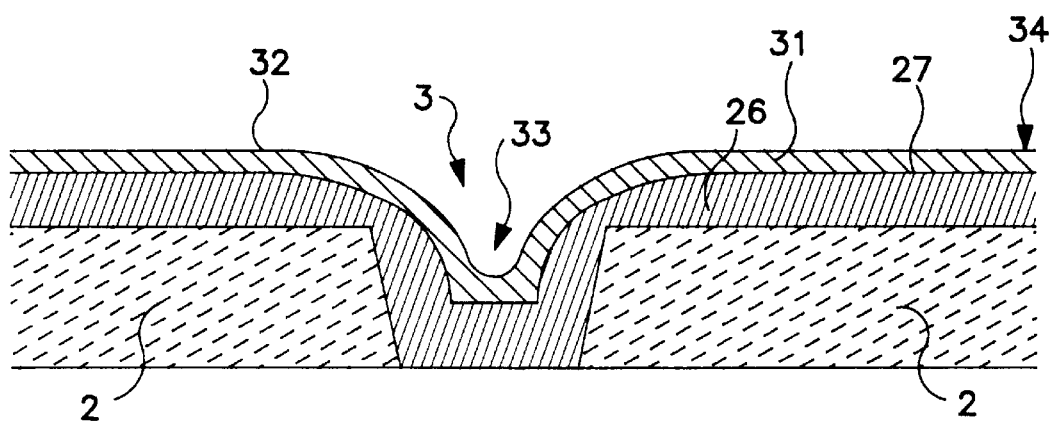

FIG. 7 shows a refractory metal film 31 deposited onto the top surface 27 of the conductive metal film 26. Refractory metal film 31 partially fills the trench 3 which was originally formed in the dielectric film 2. In the second exemplary embodiment, however, a trench-within-a-trench area 33 still exists after the deposition of the second film, the redundant layer, and refractory metal film 31. The thickness 34 of the refractory metal film 31 is chosen so that the original opening 3 is not filled after deposition of the refractory metal film 31 is complete. The refractory metal film 31 has a top surface 32. The refractory metal film 31 may be any suitable film material, such as Ti, TiN, W, or TiW used as a barrier metal in the semiconductor industry. Likewise, the equipment and conditions used to deposit the refractory metal film 31 may be suitably chosen.

Figure 8:
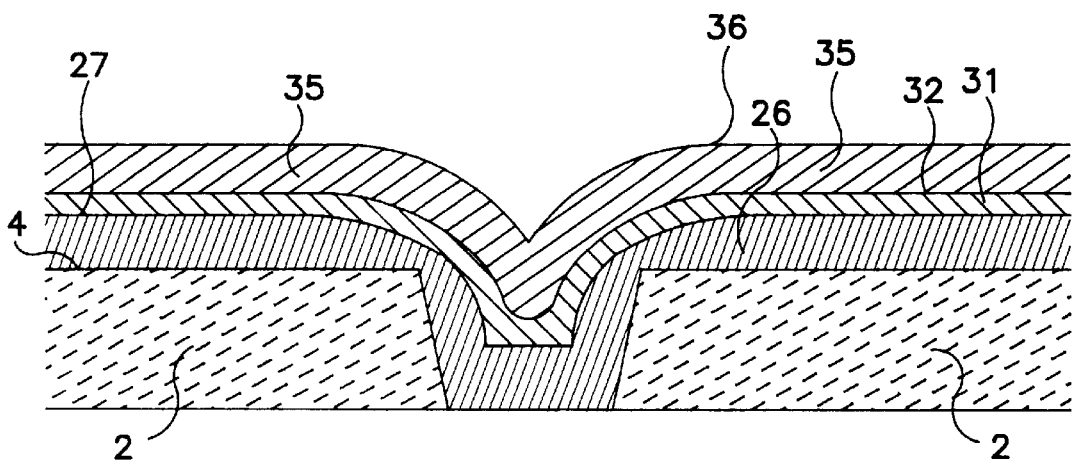

FIG. 8, also a cross-section, shows a second bulk metal conductive film 35 deposited on the top surface 32 of the redundant refractory metal film 31. The trench-within-a-trench area 33 from FIG. 7 is now completely filled. The second bulk metal conductive film 35 may be any material suitable in the semiconductor industry, such as an aluminum alloy (most typically), copper, or a copper alloy. It may be the same material as the initial bulk metal conductive film 26 or another film material may be used. Any suitable method of deposition may be used to deposit second conductive metal film 35.

Figure 9:
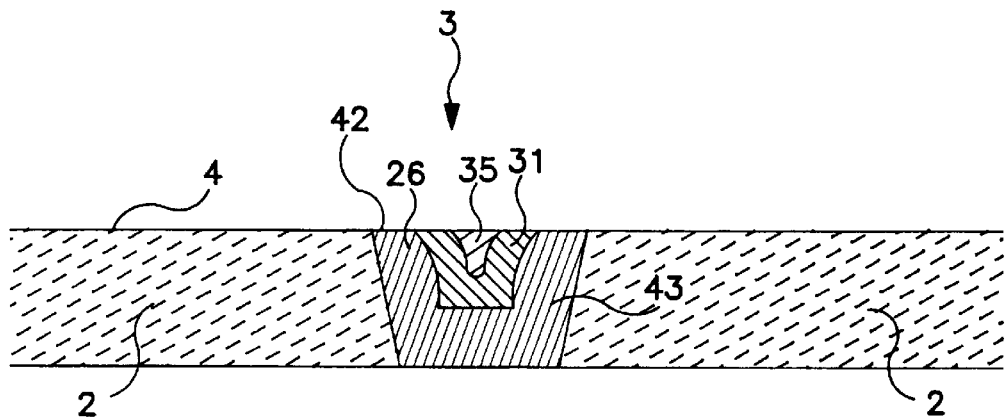

The metal film and the refractory/barrier metal film, or redundant layer film, may be chosen to either be reactive or non-reactive with each other, depending on the device application. If the films are reactive with each other, then an annealing step is conducted after the film deposition sequence is completed (and before the subsequent polishing process as depicted in FIG. 9) to form an intermetallic compound. Aluminum alloy films are commonly used to form the conductive portion of the metal interconnect lines. Aluminum alloys containing copper, silicon, or both copper and silicon are common in the semiconductor industry. Refractory/barrier metal layer films such as Ti, TiN, W, or TiW are common in the semiconductor industry.

An example of a set of films which react with each other and, therefore, which require annealing before the polishing step are an aluminum alloy film and a titanium film. An example of a set of films which do not react with each other and, therefore, do not require annealing before polishing are an aluminum alloy film and titanium nitride (TiN). It should be understood that any number of other examples of metal conductive films or barrier metal (redundant layer) films may be chosen in the present invention to form a conductive line within a trench in an integrated circuit device.

FIG. 9 shows a conductive metal line 43 after polishing. The conductive metal line 43 is formed within the original trench 3 which was formed within the dielectric film 2. The top surface 42 of the conductive metal line 43 is substantially co-planar with the top surface 4 of the dielectric film 2. The top surface 42 of the conductive metal line 43 contains portions of each of the films deposited to form the conductive metal line 43: the initial bulk metal conductive film 26, the refractory metal film 31, and the second deposited bulk metal conductive film 35. In a preferred embodiment, the conductive metal films may be aluminum alloys and the refractory metal film may be Ti.

Figure 10:
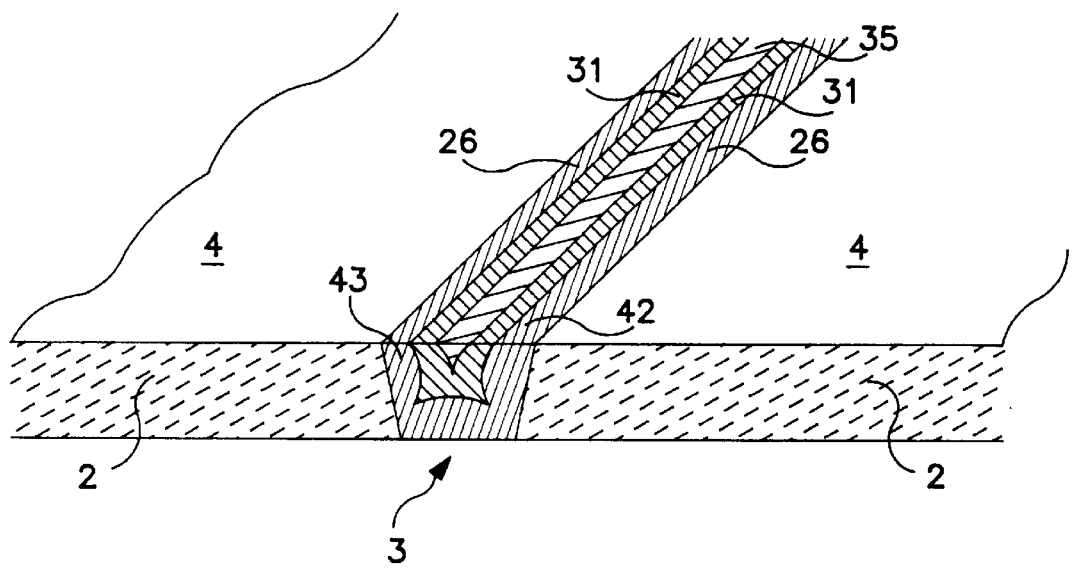

FIG. 10 shows a perspective view of the same conductive metal line 43 shown in FIG. 9. The top surface 42 of the conductive metal line 43 consists substantially of a center stripe of the second deposited bulk metal conductive film 35 formed in the center of the conductive metal line 43. The center stripe is flanked by two portions of the refractory metal film 31. The initially deposited conductive metal film 26 forms the edge regions of the conductive metal line 43 formed. Although a conductive metal line 43 within a trench as opening 3 is presented, the present invention may be formed within any type of opening 3 formed within the dielectric film 2. For example, if the opening 3 were circular, then the top surface 4 of the dielectric film 2 would comprise concentric circular regions of all films, with the first deposited film forming the periphery, the second deposited film within the periphery, and the third deposited film (for a three-film structure) forming the center.

As in the first exemplary embodiment, the bulk metal conductive film (e.g., an aluminum alloy) with a redundant layer formed within the same line or wire is resistant to electromigration failure. Also, because the top surface 42 of the conductive metal line 43 includes part of the barrier refractory metal film 31, if a subsequently deposited conductive wire (not shown) is contacted to the conductive metal line 43, it will necessarily contact part of the barrier refractory metal film 31 which forms a part of the top surface 42. This feature will reduce the likelihood of stress voiding which might sever the contact between the two wires.

Figure 11:
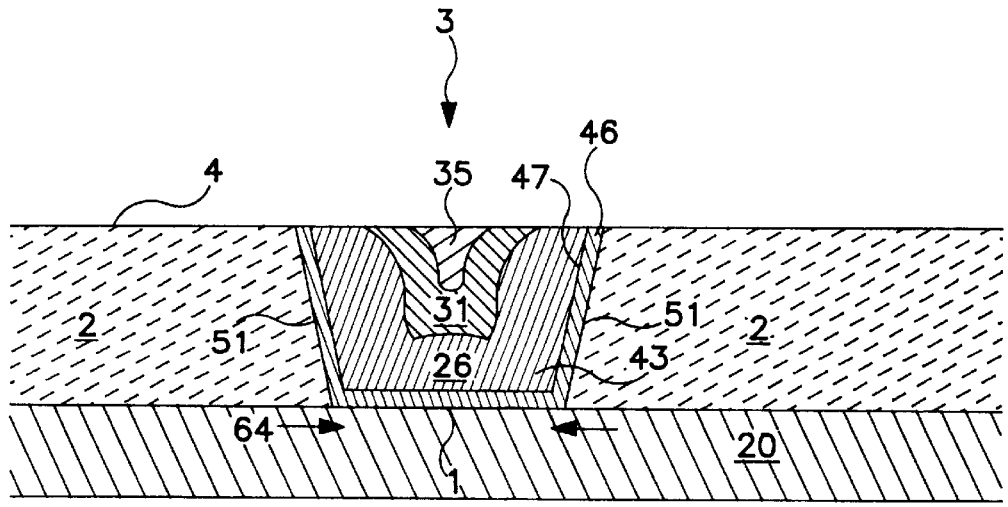
FIG. 11 is a cross sectional view of another embodiment containing a barrier film lining in the trench.

FIG. 11 shows a cross-section of another embodiment of the present invention. A liner 46 of a barrier metal film may be formed inside the opening 3 before the deposition of the first bulk alloy film. In a preferred embodiment, the barrier metal may be a refractory metal. The barrier metal liner substantially covers both the bottom surface 1 and the sidewalls 51 of opening 3. In this embodiment, opening 3 within dielectric film 2 extends down to the subjacent metal film 20, which forms the bottom surface 1 of the opening 3. The liner 46 helps to prevent electromigration of the film and stress voiding between the conductive metal line 43 and the subjacent metal film 20 which it contacts.

In this embodiment, the bulk metal conductive film 26 is deposited onto the barrier film or liner 46 and into contact with liner 46 on the bottom of the opening 3 and along the side wall portion 47 of liner 46. Subsequent formation of the damascene metal line would be essentially the same as described above. In this embodiment, however, the deposition characteristics and film thicknesses of subsequently deposited films 26, 31, and 35 would be based upon the dimensions of the opening 3 after the addition of the liner 46. For example, the width of opening 3 to be considered in selecting subsequent film thicknesses would be the width 64 of the opening 3 resulting after the liner 46 is added.

The conditions for depositing a film onto the substrate and the thickness of that film, in these and other exemplary embodiments of the present invention, will be determined by a number of factors such as the initial geometrical features of the opening in the dielectric film to be filled, the method of deposition (and associated conformality characteristics) of the film, the method of deposition and thicknesses of previously and subsequently deposited films, and the capabilities of the deposition equipment.

It should be understood that the foregoing description of preferred embodiments has been presented for the purpose of illustrating and describing the main points and concepts of the present invention. The present invention is not limited, however, to these embodiments. For example, alternate embodiments may include different structures formed within the dielectric film including, but not limited to, vias, pad regions, grooves, channels, and trenches. Alternate embodiments may include the use of different bulk conducting films and different barrier or redundant metal films. The thicknesses and relative thicknesses of the films which combine to form the present invention may also vary. The present invention provides a damascene metal line which includes a redundant layer forming part of the top surface of the line. The present invention also describes the manufacturing method used to produce this line without requiring an additional planarizing and polishing step.

What is claimed:

1. A method for producing an interconnect device in a semiconductor device, said method comprising:

(a) providing a substrate with a dielectric film positioned thereon, said dielectric film having an upper surface;

(b) forming a trench in said dielectric film, said trench extending down from said upper surface;

(c) depositing a first conductive film over said upper surface of said dielectric film and in said trench without filling said trench;

(d) depositing a refractory metal film on said first conductive film including in said trench, without filling said trench;

(e) depositing a second conductive film on said refractory metal film and filling said trench; and (f) planarizing by removing portions of said first conductive film, said refractory metal film, and said second conductive film which lie above a plane formed by said upper surface of said dielectric film to form an interconnect device within said trench, said interconnect device having a top surface which is generally co-planar with said upper surface, said top surface being formed of at least said first conductive film, said refractory metal film, and said second conductive film.

2. The method of claim 1, further comprising annealing prior to said step (f).

3. The method of claim 1, wherein said top surface is generally co-planar with said upper surface of said dielectric film.

4. The method of claim 1, wherein the refractory metal film is chosen to form a shunt layer resistant to electromigration and stress voiding.

5. The method of claim 1, wherein said first conductive film and said second conductive film comprise the same material.

6. The method of claim 1, wherein at least one of said first conductive film and said second conductive film comprise an aluminum alloy.

7. The method of claim 6, wherein said aluminum alloy includes aluminum and silicon.

8. The method of claim 6, wherein said aluminum alloy includes aluminum and copper.

9. The method of claim 7, wherein said aluminum alloy further includes copper.

10. The method of claim 1, wherein said refractory metal film comprises titanium.

11. The method of claim 1, wherein said refractory metal film comprises titanium nitride.

12. The method of claim 2, wherein said refractory metal film forms an intermetallic compound with at least said first conductive film.

13. The method of claim 2, wherein said refractory metal film forms an intermetallic compound with at least said second conductive film.

14. The method of claim 1, wherein at least one of said first conductive film and said second conductive film comprise a copper alloy.

15. The method of claim 1, wherein at least one of said first conductive film and said second conductive film comprise copper.

16. The method of claim 1, wherein said step (f) comprises polishing.

17. The method of claim 16, wherein said polishing comprises chemical mechanical polishing.

18. A method for producing an interconnect wire in a semiconductor device, said method comprising:

(a) providing a substrate with a dielectric film positioned thereon, said dielectric film having an upper surface;

(b) forming grooves in said dielectric film, said grooves extending down from said upper surface;

(c) depositing a first conductive film over said upper surface of said dielectric film and in said grooves without filling said grooves;

(d) depositing a refractory metal film on said first conductive film including in said grooves without filling said grooves;

(e) depositing a second conductive film on said refractory metal film and filling said grooves;

(f) annealing said films; and (g) planarizing by removing portions of said first conductive film, said refractory metal film, and said second conductive film which lie above a plane formed by said upper surface to form an interconnect wire within said grooves;

wherein a top surface of said interconnect wire is generally co-planar with said upper surface and is formed of said first conductive film, said refractory metal film, and said second conductive film.

19. The method of claim 18 wherein said top surface of said interconnect wire is substantially co-planar with said upper surface of said dielectric film and said interconnect wire further comprises:

a) two oppositely disposed outer edges;

b) a central portion formed of said second conductive film, and extending centrally along the lengthwise direction of said interconnect wire;

c) two adjacent portions formed of said refractory metal film, each of said adjacent portions disposed on a respective side of said central portion, and extending along the lengthwise direction of the interconnect wire; and d) two outer portions formed of said first conductive film, each of said outer portions disposed between a respective adjacent portion and a corresponding said edge of said wire, and extending along the lengthwise direction of said interconnect wire.

20. The method of claim 1, further comprising the step of:

(b1) forming a refractory metal liner on said upper surface of said dielectric film and within said trench prior to said step (c), said refractory metal liner not filling said trench; and in which said step (c) includes depositing said first conductive film on said refractory metal liner; and wherein said step (f) further comprises removing portions of said refractory metal liner which lie above said plane formed by said upper surface of said dielectric film.

\* \* \* \* \*